US009548256B2

(12) United States Patent
Uehling

(10) Patent No.: US 9,548,256 B2
(45) Date of Patent: Jan. 17, 2017

(54) HEAT SPREADER AND METHOD FOR FORMING

(71) Applicant: FREESCALE SEMICONDUCTOR, INC., Austin, TX (US)

(72) Inventor: Trent S. Uehling, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/628,852

(22) Filed: Feb. 23, 2015

(65) Prior Publication Data
US 2016/0247744 A1 Aug. 25, 2016

(51) Int. Cl.
H01L 23/373 (2006.01)
C23C 14/34 (2006.01)
H01L 23/00 (2006.01)
F28F 3/04 (2006.01)
H01L 23/367 (2006.01)
H01L 21/48 (2006.01)

(52) U.S. Cl.
CPC ............ *H01L 23/373* (2013.01); *C23C 14/34* (2013.01); *F28F 3/04* (2013.01); *H01L 21/4871* (2013.01); *H01L 23/367* (2013.01); *H01L 23/3736* (2013.01); *H01L 24/32* (2013.01); *H01L 24/83* (2013.01); *H01L 2224/32245* (2013.01); *H01L 2924/01006* (2013.01); *H01L 2924/01013* (2013.01); *H01L 2924/01028* (2013.01); *H01L 2924/01029* (2013.01)

(58) Field of Classification Search
CPC ...... H01L 23/3736; H01L 24/83; H01L 24/32; H01L 2924/01028; H01L 2924/01006; H01L 2924/01013; H01L 2924/01029; H01L 21/4871; H01L 23/367; H01L 23/373; F28F 3/04; C23C 14/34
USPC ........................................................ 257/712
See application file for complete search history.

(56) References Cited

U.S. PATENT DOCUMENTS

| 8,480,931 | B2 | 7/2013 | Choi et al. | |
|---|---|---|---|---|
| 2010/0085713 | A1 | 4/2010 | Balandin et al. | |
| 2012/0248414 | A1* | 10/2012 | Kim | B82Y 10/00 257/29 |
| 2013/0048339 | A1* | 2/2013 | Tour | H01B 1/04 174/126.1 |
| 2016/0057854 | A1* | 2/2016 | Schneider | H05K 1/0271 174/252 |

OTHER PUBLICATIONS

Zhao et al, "Fabrication and tensile properties of grapheme/copper composites prepared by electroless plating for structural applications", physica status solidi a (pss) applications and materials science, Sep. 2014, pp. 1-8.

(Continued)

Primary Examiner — Caleen Sullivan

(57) ABSTRACT

The present disclosure provides embodiments for a semiconductor structure including a heat spreader that includes a graphene grid having a first major surface and a second major surface opposite the first major surface. The graphene grid has a plurality of holes, each hole having a first opening in the first major surface and a second opening in the second major surface. The heat spreader also includes a first copper portion covering the first major surface of the graphene grid, a second copper portion covering the second major surface of the graphene grid, and a plurality of copper vias filling the plurality of holes.

15 Claims, 3 Drawing Sheets

(56) References Cited

OTHER PUBLICATIONS

Pop et al, "Thermal properties of grapheme: Fundamentals and applications", MRS Bulletin, 2012, 28 pages, vol. 37.
Hwang et al, "Deposition of Few Layer Graphene on Plastic Substrate for using Conductive Layer at Metal Electroplating", http://www.pdfdrive.net/deposition-of-few-layer-graphene-on-plastic-substrate-for-e10428956.html, 2011, 5 pages, Suwon, South Korea.

* cited by examiner

HEAT SPREADER AND METHOD FOR FORMING

BACKGROUND

Field

This disclosure relates generally to semiconductor processing, and more specifically, to a heat spreader for a packaged semiconductor device.

Related Art

As semiconductor technology advances, semiconductor devices have decreased in size, thus allowing for a higher density of circuits within packaged devices. The higher the density, the greater the power requirements and thus the greater the amount of heat generation. The heat needs to be sufficiently dissipated to a heat sink or ambient air in order to protect the devices. For example, in high-power-density microelectronics, such as with 3D packaging having stacked integrated circuits, large amounts of heat are generated which, if not properly dissipated, may prevent the integrated circuits from operating correctly. However, traditional single conductor heat sinks which attach to the top or bottom of a packaged device do not draw sufficient heat. Therefore, a need exists for a heat spreader which provides improved thermal dissipation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In high power density circuits, as described above, effective thermal dissipation is needed to appropriately protect the devices. Therefore, in accordance with one embodiment of the present invention, in order to achieve sufficient thermal dissipation, a heat spreader is provided which provides both lateral heat dissipation (i.e. in-plane heat dissipation) and vertical heat dissipation (i.e. out-of-plane heat dissipation). The heat spreader includes a graphene grid having a plurality of openings which is electroplated with a conductive material, such as copper. The conductive material coats the major surfaces of the graphene grid as well as fills the openings to form a plurality of conductive vias. The graphene grid provides for improved lateral heat dissipation while the conductive material plated on the surfaces of the graphene grid and within the openings provides for out-of-plane heat dissipation. In this manner, the heat spreader provides improved thermal dissipation and may be used with semiconductor devices.

Figure 1:
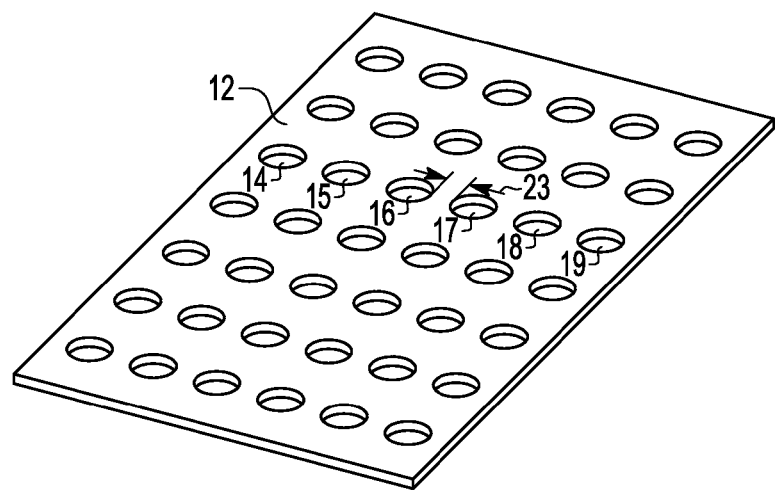
FIG. 1 illustrates a top down view of a heat spreader at a stage in processing in accordance with an embodiment of the present invention.

FIG. 1 illustrates a top down view of a heat spreader 10 at a stage in processing in accordance with one embodiment of the present invention. Heat spreader 10 includes a graphene grid 12. Graphene grid 12 is formed by forming a plurality of openings, including openings 14-19, within a graphene sheet. Note that openings 14-19 may be referred to as holes and extend from a first major surface of the graphene sheet through to a second major surface of the graphene sheet. A diameter of each opening may be in a range of 0.05 mm to 2 mm. In one embodiment, each opening has diameter which has a ratio to a minimum width of the graphene grid between itself and a neighboring opening of 10:1. For example, a diameter of opening 16 is ten times greater than a minimum width 23 of graphene grid 12 between openings 16 and 17. Alternatively, this ratio of opening to grid width may be in a range of 1:1 to 20:1. Note that openings 14-19 can be circular, as shown, or of any other shape in which the diameter of the opening may refer to a maximum width of the opening. In one embodiment, the graphene sheet has a thickness of one atomic layer. Alternatively, the graphene sheet may have a thickness of up to 10 atomic layers. In one embodiment, the graphene sheet may have a thickness of 0.035 to 10 microns. Due to the thinness of the graphene sheet, the graphene sheet may be provided with a conductive backing plate, such as a copper backing plate, for stability. In this case, the graphene sheet, and thus graphene grid 12, includes both the graphene and the conductive backing plate, in which the plurality of openings are formed through both the graphene and conductive backing plate. Therefore, if a copper backing plate is present, the first major surface of graphene grid 12 includes graphene and the second major surface of graphene grid 12 includes copper.

Figure 2:
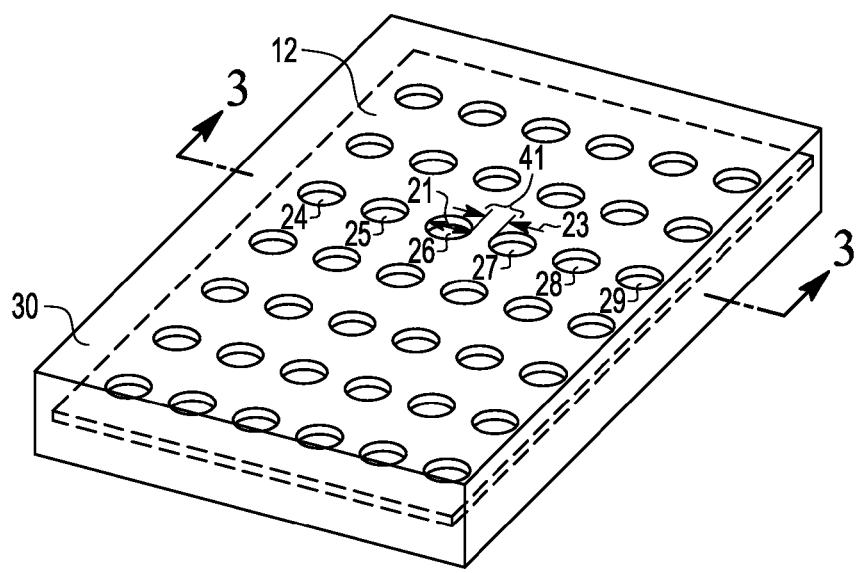
FIG. 2 illustrates a top down view of the heat spreader of FIG. 1 at a subsequent stage in processing in accordance with an embodiment of the present invention.

FIG. 2 illustrates a top down view of heat spreader 10 in accordance with one embodiment of the present invention at a subsequent stage in processing. Exposed graphene surfaces of graphene grid 12 are first treated in order to create bonding surfaces for better adhesion of subsequently applied layers. Therefore, in the case that no conductive backing plate is present, both the first and second major surfaces of graphene grid 12 are treated. After the exposed surfaces of graphene grid 12, including the sidewalls of the plurality of openings, are treated, a copper seed layer is formed on the exposed surfaces. The seed layer may be formed by sputtering copper onto graphene grid 12. The seed layer is formed on the first and second major surfaces of graphene grid 12 and on the sidewalls of the openings. Note that if a copper backing plate is present, the sputtering may still be applied to the copper of the second major surface of graphene grid 12. After formation of the seed layer, a copper layer 30 is plated onto graphene grid 12 using the seed layer in which copper layer 30 is formed on all surfaces of graphene grid 12 and fills the openings of graphene grid 12 resulting in a plurality of copper vias, such as copper vias 24-29. Therefore, copper layer 30 may surround graphene grid 12, as illustrated in FIG. 2. Known electroless or electrolytic plating techniques may be used for the copper plating. In one embodiment, after the copper plating, heat spreader 10 has a thickness in a range of 0.1 mm to 5 mm.

Figure 3:
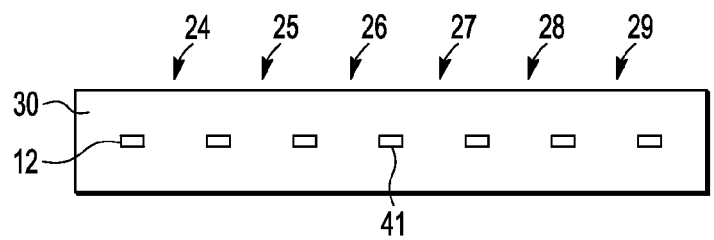
FIG. 3 illustrates a cross section view of the heat spreader of FIG. 2.
Figure 4:
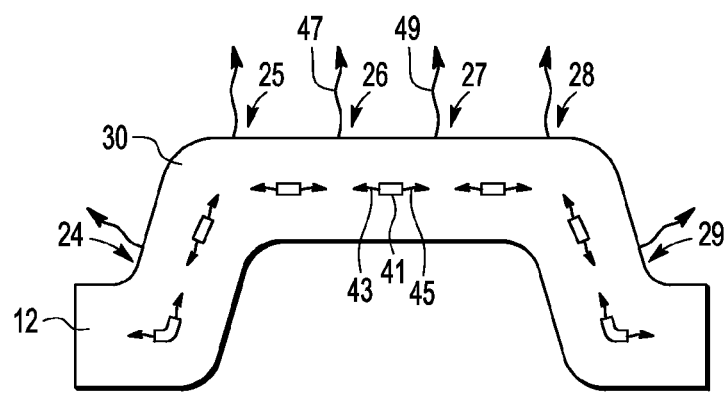
FIG. 4 illustrates a cross section of the heat spreader of FIG. 3 at a subsequent stage in processing, in accordance with an embodiment of the present invention.

FIG. 3 illustrates a cross section view of heat spreader 10 of FIG. 2, as taken through conductive vias 24-29. A first portion of copper layer 30 is located on and covers the first major surface of graphene grid 12, a second portion of copper layer 30 is located on and covers the second major surface of graphene grid 12, and a third portion of copper layer 30 is located on and covers the minor surfaces of graphene grid 12, in which the minor surfaces are perpendicular to the first and second major surfaces. FIG. 4 illustrates a cross sectional view of heat spreader 10 of FIG. 3 after stamping the plated graphene grid. Heat spreader 10 is stamped to form a cavity which, as will be seen in FIG. 5 below, covers a packaged semiconductor device. Heat spreader 10 may be stamped to form any shape needed based on the design of the packaged semiconductor device.

As seen in FIG. 4, heat spreader 10 includes both graphene portions and copper portions, such as graphene portion 41 between copper vias 26 and 27. Graphene, as a material, provides good in-plane thermal conductivity due to the covalent bonding between carbon atoms. For example, a monolayer of graphene provides in-plane thermal conductivity in a range of 500-4000 Watts/meter-Kelvin (W/m-K). A thicker layer would provide less in-plane thermal conductivity. In one embodiment, a thickness of the graphene sheet used to form graphene grid 12 should provide at least 500 W/m-K. However, graphene provides weak out-of-plane heat flow due to weak van der Waals coupling. For example, a five layer thick sheet of graphene provides out-of-plane thermal conductivity of less than 10 W/m-K. On the other hand, copper provides good out-of-plane heat dissipation but weak in-plane thermal conductivity compared to graphene. For example, copper has an out-of-plane conductivity within a range of 200 to 400 W/m-K. Therefore, the combination of both the graphene and the copper of heat spreader 10 is capable of providing improved thermal dissipation by providing both in-plane and out-of-plane thermal dissipation.

Each of conductive vias 24-29 allows for heat to dissipate out-of-plane to the top surface of heat spreader 10. The graphene portions of graphene grid 12, such as graphene portion 41, provide for in-plane heat dissipation which dissipates heat laterally into the adjacent conductive vias. For example, graphene portion 41 dissipates heat in-plane, as represented by heat arrows 43 and 45. Conductive vias 26 and 27 are then able to provide out-of-plane heat dissipation as represented by heat arrows 47 and 49. In this manner, improved heat dissipation may be achieved.

The above embodiments of heat spreader 10 have been described in reference to a graphene grid 12 with a copper layer 30. However, in alternate embodiments, other materials may be used in which a first material of heat spreader 10, such as graphene, provides for good in-plane heat dissipation, and a second material of heat spreader 10, such as copper, provides for good out-of-plane heat dissipation. Alternate embodiments may use other conductive layers for the second material, such as, for example, aluminum or nickel. In one embodiment, the conductive layer of the second material is of the same material as the conductive backing plate of the graphene sheet, if present.

Figure 5:
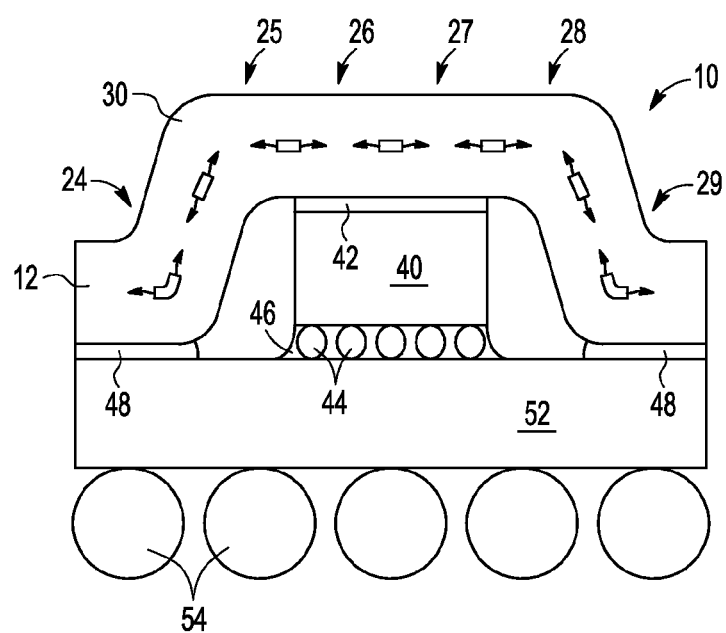
FIG. 5 illustrates a cross section view of a semiconductor device assembly including the heat spreader of FIG. 4, in accordance with an embodiment of the present invention.

FIG. 5 illustrates a cross-sectional view of a semiconductor device assembly 50 (also referred to as a semiconductor structure) including heat spreader 10. A packaged semiconductor device 40, which may be a flip chip device, is attached to a top surface of a package substrate 52 by way of electrical interconnects 44, such as with a bump array. Alternatively, device 40 may be other types of packaged devices containing any number of semiconductor die. Also, different types of electrical interconnects may be used, such as wire bonds. An underfill 46 is present between device 40 and package substrate 52 and between the electrical interconnects. An adhesive 48 is applied is applied to the top surface of package substrate 52 and a thermal interface material (TIM) 42 is applied to a top surface of device 40. Heat spreader 10 is attached to package substrate 52 with adhesive 48. TIM 42 between device 40 and heat spreader 10 provides a thermal conductor to dissipate heat from device 40 to heat spreader 10. Heat spreader 10 dissipates heat to the ambient air, or, in an alternate embodiment, a heat sink which may be attached to heat spreader 10. Electrical interconnects, such as solder balls, are formed on the bottom side of package substrate 52 which may be used to provide electrical connections between device 40 and a printed circuit board (PCB).

Figure 6:
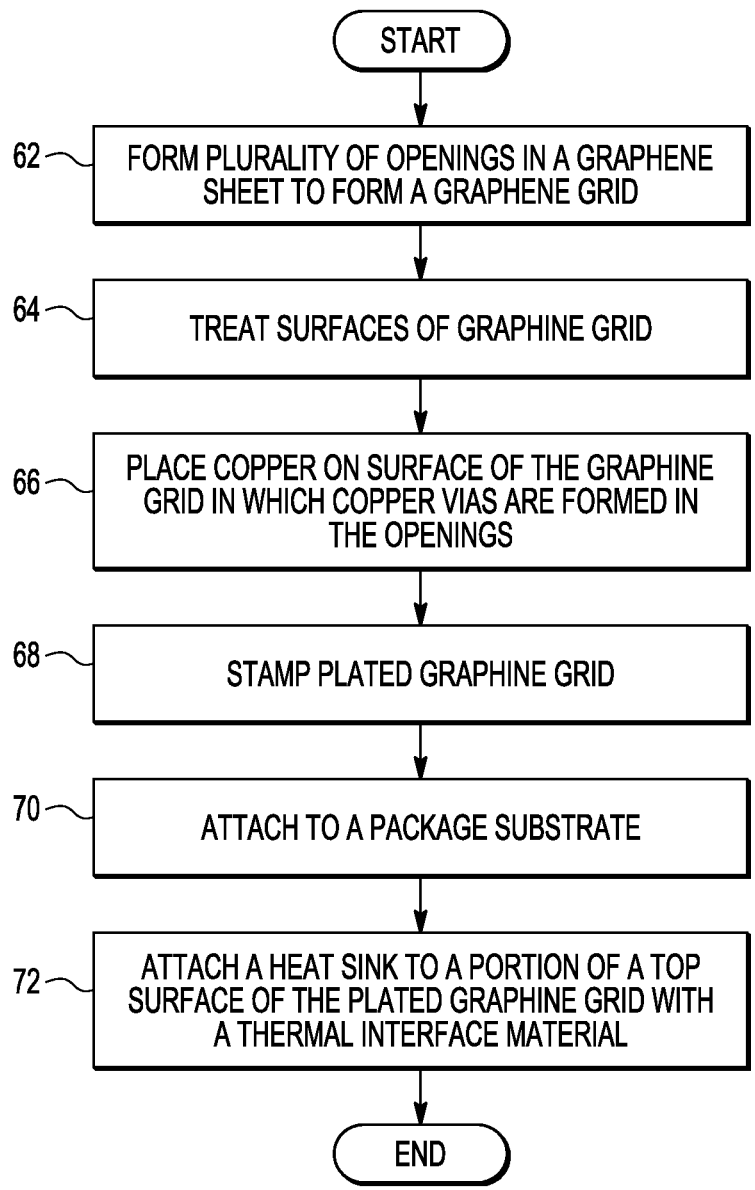
FIG. 6 illustrates a method for forming the heat spreader and semiconductor device assembly of FIG. 5 in accordance with an embodiment of the present invention.

FIG. 6 illustrates, in flow diagram form, a method 60 for forming a semiconductor device assembly, such as assembly 50. Method 60 begins with block 62 in which a plurality of openings are formed in a graphene sheet to form a graphene grid, such as grid 12 described above in reference to FIG. 1. For example, the graphene sheet may be perforated or punched to form the openings. As described above, the graphene sheet may include a conductive backing plate. Method 60 proceeds to block 64 in which exposed graphene surfaces of the graphene grid are treated to create a bondable surface for improved adhesion of subsequently applied layers. Method 60 then proceeds to block 66 in which copper is plated on surfaces of the graphene grid in which copper fills the openings to form copper vias in the openings. As described above, alternate embodiments may use a different conductive material other than copper but which has better out-of-plane properties than graphene. The plated graphene grid may then be used as a heat spreader for a semiconductor device. Method 60 then proceeds to block 68 in which the plated graphene grid is stamped, as described above in references to FIG. 4. Note that in an alternate embodiment, other modifications in addition to or instead of stamping may be performed to shape the heat spreader as needed for a particular device assembly. Method 60 proceeds to block 70 in which the plated graphene grid is attached to a package substrate in which the plated graphene grid functions as a heat spreader for the semiconductor device assembly, as was described, for example, in reference to FIG. 5 above. In one embodiment, method 60 ends with block 70. In an alternate embodiment, method 60 ends with block 72 in which after the heat spreader is attached to the package substrate, a heat sink is attached to a portion of a top surface of the plated graphene grid (i.e. the heat spreader) with a thermal interface material. Any type or form of heat sink may be used.

Therefore, by now it can be understood how a heat spreader having a first material selected for its in-pane heat dissipation properties, such as graphene, and having a second material selected for its out-of-plane heat dissipation properties, such as copper, can provide improved heat dissipation from a semiconductor device. For example, a graphene grid with copper on its major surfaces and extending through openings in the graphene grid can provide improved thermal dissipation.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, heat spreader 10 may be formed into different shapes as needed to fit a device assembly while still providing effective in-plane and out-of-plane heat dissipation. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a semiconductor structure includes a heat spreader in which the heat spreader includes a graphene grid having a first major surface and a second major surface opposite the first major surface. The graphene grid has a plurality of holes, each hole having a first opening in the first major surface and a second opening in the second major surface. The heat spreader further includes a first copper portion covering the first major surface of the graphene grid, a second copper portion covering the second major surface of the graphene grid, and a plurality of copper vias filling the plurality of holes. In one aspect, the heat spreader further includes a third copper portion covering one or more minor surfaces of the graphene sheet that are perpendicular to the first and second major surfaces of the graphene sheet. In another aspect, the graphene grid has a thickness of at most 10 atomic layers of graphene. In another aspect, a thickness of the graphene grid is within an inclusive range of 0.035 microns to 10 microns. In another aspect, a thickness of the heat spreader is within an inclusive range of 0.1 mm to 5 mm. In another aspect, a width of each first opening is within an inclusive range of 0.05 mm to 2 mm. In another aspect, each of the first openings have a width, and the width is up to twenty times larger than a minimum distance measured between a pair of first openings.

In another embodiment, a packaged semiconductor device includes a heat spreader. The heat spreader includes a grid of a first conductive material having a plurality of holes, a plurality of vias of a second conductive material, wherein the plurality of vias fill the plurality of holes of the grid, and a layer of the second conductive material that surrounds the grid. In one aspect of the another embodiment, the first conductive material has in-plane thermal conductivity within an inclusive range of 2000 to 4000 W/m-K. In another aspect, the second conductive material has out-of-plane thermal conductivity within an inclusive range of 500 to 400 W/m-K. In another aspect, a portion of a bottom surface of the heat spreader is attached to a semiconductor die with a thermal interface material. In another aspect, a portion of a bottom surface of the heat spreader is attached to a package substrate with an adhesive material. In another aspect, the first conductive material comprises graphene. In another aspect, the second conductive material comprises at least one of copper, nickel, or aluminum. In another aspect, a heat sink is attached to a portion of a top surface of the heat spreader with a thermal interface material.

In yet another embodiment, a method includes perforating a graphene sheet with a plurality of holes to produce a graphene grid; treating a surface of the graphene grid to create a bondable surface on the graphene grid; sputtering a seed layer of a conductive material on the bondable surface of the graphene grid; plating the graphene grid with the conductive material to produce a plated graphene grid, wherein the plating fills the plurality of holes with the conductive material; and stamping the plated graphene grid to form a heat spreader. In one aspect of the yet another embodiment, the method further includes attaching the heat spreader to a package substrate with adhesive material. In another aspect, the method further includes attaching the heat spreader to a semiconductor die with a thermal interface material. In another aspect, the conductive material includes one of copper, nickel, or aluminum. In another aspect, the graphene sheet comprises a backing plate of the conductive material.

What is claimed is:

1. A semiconductor structure comprising:
 a heat spreader comprising:
  a graphene grid having a first major surface and a second major surface opposite the first major surface, wherein
   the graphene grid has a plurality of holes, each hole having a first opening in the first major surface and a second opening in the second major surface,
  a first copper portion covering the first major surface of the graphene grid,
  a second copper portion covering the second major surface of the graphene grid, and
  a plurality of copper vias filling the plurality of holes.

2. The semiconductor structure of claim 1, wherein the heat spreader further comprises a third copper portion covering one or more minor surfaces of the graphene sheet that are perpendicular to the first and second major surfaces of the graphene sheet.

3. The semiconductor structure of claim 1, wherein the graphene grid has a thickness of at most 10 atomic layers of graphene.

4. The semiconductor structure of claim 1, wherein a thickness of the graphene grid is within an inclusive range of 0.035 microns to 10 microns.

5. The semiconductor structure of claim 1, wherein a thickness of the heat spreader is within an inclusive range of 0.1 mm to 5 mm.

6. The semiconductor structure of claim 1, wherein a width of each first opening is within an inclusive range of 0.05 mm to 2 mm.

7. The semiconductor structure of claim 1, wherein each of the first openings have a width, and the width is up to twenty times larger than a minimum distance measured between a pair of first openings.

8. A packaged semiconductor device comprising:
a heat spreader comprising:
   a grid of a first conductive material having a plurality of holes,
   a plurality of vias of a second conductive material, wherein the plurality of vias fill the plurality of holes of the grid, and
   a layer of the second conductive material that surrounds the grid.

9. The packaged semiconductor device of claim 8, wherein the first conductive material has in-plane thermal conductivity within an inclusive range of 2000 to 4000 W/m-K.

10. The packaged semiconductor device of claim 8, wherein the second conductive material has out-of-plane thermal conductivity within an inclusive range of 500 to 400 W/m-K.

11. The packaged semiconductor device of claim 8, wherein a portion of a bottom surface of the heat spreader is attached to a semiconductor die with a thermal interface material.

12. The packaged semiconductor device of claim 8, wherein a portion of a bottom surface of the heat spreader is attached to a package substrate with an adhesive material.

13. The packaged semiconductor device of claim 8, wherein the first conductive material comprises graphene.

14. The packaged semiconductor device of claim 8, wherein the second conductive material comprises at least one of copper, nickel, or aluminum.

15. The packaged semiconductor device of claim 8, wherein a heat sink is attached to a portion of a top surface of the heat spreader with a thermal interface material.

\* \* \* \* \*